US011303265B2

(12) United States Patent
Jo et al.

(10) Patent No.: US 11,303,265 B2
(45) Date of Patent: Apr. 12, 2022

(54) MIXER

(71) Applicant: Nippon Telegraph and Telephone Corporation, Tokyo (JP)

(72) Inventors: Teruo Jo, Tokyo (JP); Hiroshi Hamada, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/047,899

(22) PCT Filed: Apr. 8, 2019

(86) PCT No.: PCT/JP2019/015300
§ 371 (c)(1),
(2) Date: Oct. 15, 2020

(87) PCT Pub. No.: WO2019/203044
PCT Pub. Date: Oct. 24, 2019

(65) Prior Publication Data
US 2021/0175874 A1  Jun. 10, 2021

(30) Foreign Application Priority Data
Apr. 17, 2018  (JP) .............................. JP2018-078982

(51) Int. Cl.
  *H03H 11/40* (2006.01)
  *H03H 11/48* (2006.01)
  *H03D 7/12* (2006.01)
(52) U.S. Cl.
  CPC .............. *H03H 11/481* (2013.01); *H03D 7/12* (2013.01); *H03H 11/40* (2013.01)

(58) Field of Classification Search
  CPC ......... H03H 11/481; H03H 11/40; H03D 7/12
  See application file for complete search history.

(56) References Cited

U.S. PATENT DOCUMENTS

| | | | |
|---|---|---|---|
| 7,863,980 B2 * | 1/2011 | Golden | H03H 11/481 330/149 |
| 8,183,896 B2 * | 5/2012 | Jung | H04B 1/28 327/116 |
| 8,228,120 B2 * | 7/2012 | Mole | H03F 3/45098 330/252 |
| 8,704,601 B2 * | 4/2014 | Nam | H03F 3/45179 330/310 |
| 2015/0372844 A1 | 12/2015 | Elwart et al. | |

FOREIGN PATENT DOCUMENTS

| | | |
|---|---|---|
| JP | S60157317 A | 8/1985 |
| JP | 2002164745 A | 6/2002 |

OTHER PUBLICATIONS

Stephen A. Maas, "A GaAs MESFET mixer with very low intermodulation," IEEE Transactions on Microwave Theory and Techniques, vol. 35, No. 4, Apr. 1987, pp. 425 429.

* cited by examiner

*Primary Examiner* — Dinh T Le
(74) *Attorney, Agent, or Firm* — Slater Matsil, LLP

(57) ABSTRACT

A negative capacitance circuit is connected between a drain and a source of the mixer transistor. With this configuration, the negative capacitance circuit is connected in parallel to a parasitic capacitance generated between the drain and the source of the mixer transistor, and the parasitic capacitance can be canceled out in a wide band by the negative capacitance circuit connected in parallel.

18 Claims, 9 Drawing Sheets

MIXER

CROSS-REFERENCE TO RELATED APPLICATIONS

This application is a national phase entry of PCT Application No. PCT/JP2019/015300, filed on Apr. 8, 2019, which claims priority to Japanese Application No. 2018-078982, filed on Apr. 17, 2018, which applications are hereby incorporated herein by reference.

TECHNICAL FIELD

The present invention relates to a mixer that frequency-converts an input signal.

BACKGROUND

A mixer is an important circuit (a frequency conversion circuit) that plays a role in frequency conversion among circuits constituting communication or radar circuits. Particular examples of mixers include a mixer in which a resistive mixer that has high linearity and can be configured of a single transistor is used (see, for example, NPL 1).

FIG. 7 illustrates the main units of a resistive mixer 300 of the related art. This resistive mixer includes a single transistor (field effect transistor) 1. This single transistor (hereinafter referred to as a mixer transistor) 1 has a gate connected to an LO signal terminal (LO: local oscillation frequency) P1, and a drain connected to an RF signal terminal (RF: high-frequency signal) P2 and an IF signal terminal P3 (IF: intermediate frequency). A source of the mixer transistor 1 is grounded.

In this resistive mixer 300, drain impedance of the mixer transistor 1 changes with time between an ON state and an OFF state according to a voltage of an LO signal applied to the LO signal terminal P1 and multiplied by an RF signal or an IF signal. Therefore, the conversion efficiency of the mixer improves as the drain impedance becomes smaller in a state in which the mixer transistor 1 is ON and the drain impedance increases in a state in which the mixer transistor 1 is OFF.

CITATION LIST

Non Patent Literature

NPL 1—Maas, Stephen A. "A GaAs MESFET mixer with very low intermodulation." IEEE Transactions on Microwave Theory and Techniques 35.4 (1987): 425-429.

SUMMARY

Technical Problem

However, in this resistive mixer 300, there is a parasitic capacitance Cp between a drain and a source of the mixer transistor 1 as illustrated in FIG. 8. Therefore, there is no problem when the mixer transistor 1 is ON (see FIG. 9(a)), whereas a signal flows to a ground through the parasitic capacitance Cp when the mixer transistor 1 is OFF (see FIG. 9(b)) and there is a problem that off-impedance decreases. This problem becomes particularly noticeable in a millimeter wave band and a terahertz wave band because impedance of capacitance decreases at a higher frequency.

It is easily conceivable to attach an inductor between the drain and the source of the mixer transistor 1 in order to cancel out the parasitic capacitance Cp, but an effective frequency is a very narrow band.

Embodiments of the present invention have been made in order to solve such a problem, and an object of embodiments of the present invention is to provide a mixer capable of canceling out parasitic capacitance in a wide band, increasing off-impedance, and improving frequency conversion efficiency.

Means for Solving the Problem

In order to achieve such an object, embodiments of the present invention include a mixer transistor (1) having a gate connected to an LO signal terminal (P1) and a drain connected to an RF signal terminal (P2) and an IF signal terminal (P3); and a negative capacitance circuit (2) connected between the drain and a source of the mixer transistor (1).

According to embodiments of the present invention, the negative capacitance circuit (2) is connected in parallel to a parasitic capacitance (Cp) generated between the drain and the source of the mixer transistor (1), and the parasitic capacitance (Cp) can be canceled out in a wide band by the negative capacitance circuit (2) connected in parallel.

In the above description, components in the drawings corresponding to components of embodiments of the invention are denoted by reference signs with parentheses, for example.

Effects of Embodiments of the Invention

As described above, according to embodiments of the present invention, since the negative capacitance circuit is connected between the drain and the source of the mixer transistor, the negative capacitance circuit is connected in parallel to the parasitic capacitance generated between the drain and the source of the mixer transistor, and the parasitic capacitance is canceled out in a wide band by the negative capacitance circuit connected in parallel. Thus, it is possible to increase off-impedance and improve frequency conversion efficiency.

DETAILED DESCRIPTION OF ILLUSTRATIVE EMBODIMENTS

Hereinafter, embodiments of the present invention will be described in detail with reference to the drawings.

Embodiment 1

Figure 1:
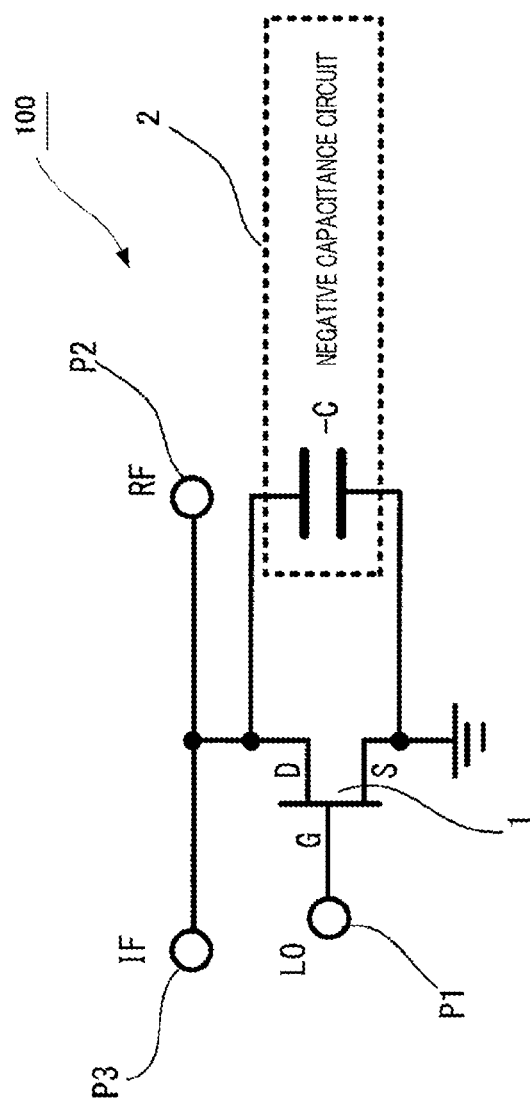
FIG. 1 illustrates main units of a resistive mixer according to Embodiment 1 of the present invention.
Figure 7:
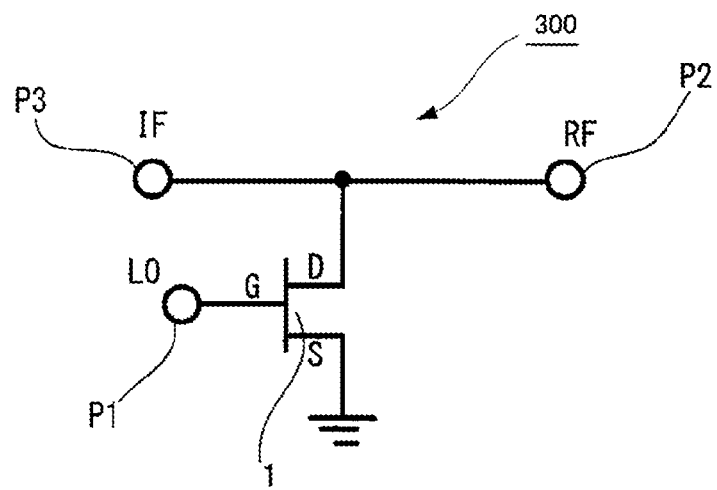
FIG. 7 is a diagram illustrating main units of a resistive mixer of the related art.
Figure 8:
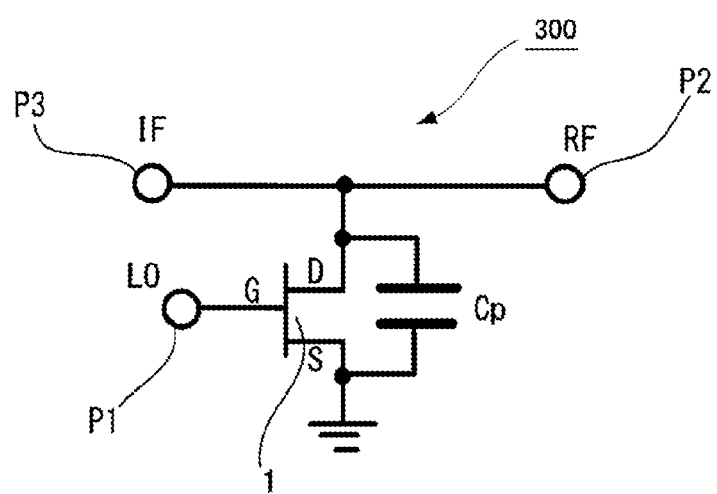
FIG. 8 is a diagram illustrating a parasitic capacitance generated between a drain and a source of a mixer transistor in the resistive mixer of the related art.
Figure 9:
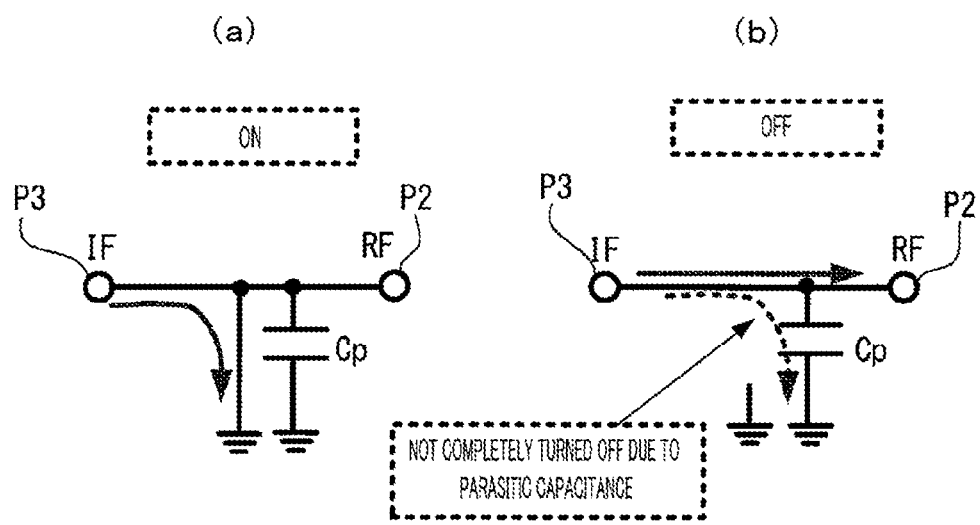
FIG. 9 is a diagram illustrating a flow of a signal when a mixer transistor in the resistive mixer of the related art is ON and OFF.

FIG. 1 is a diagram illustrating main units of a resistive mixer 100 according to Embodiment 1 of the present invention. In FIG. 1, the same reference signs as those in FIG. 7 denote components the same as or equivalent to those described with reference to FIG. 7, and description thereof will be omitted.

Figure 2:
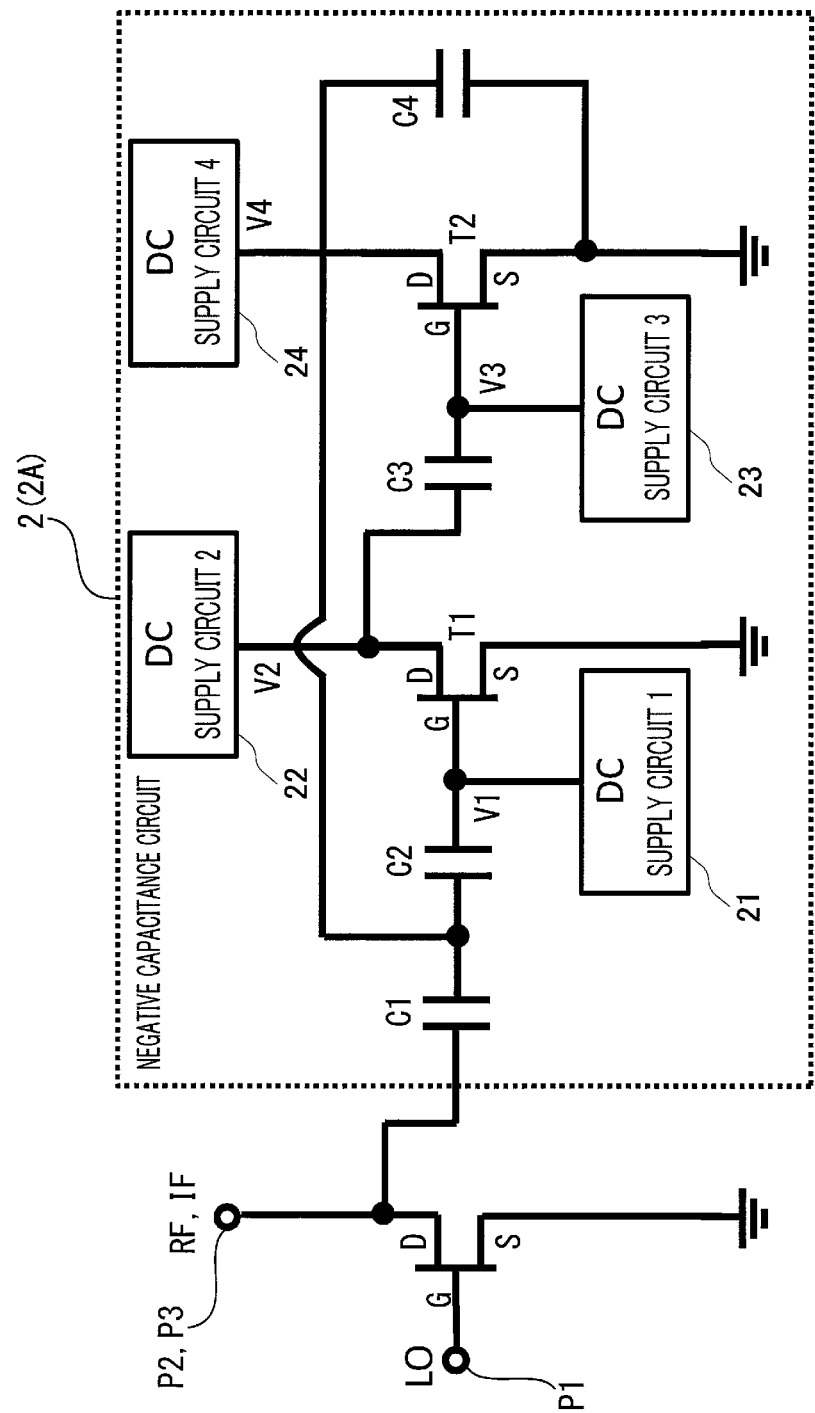
FIG. 2 is a diagram illustrating a specific example of a negative capacitance circuit connected between a drain and a source of a mixer transistor in the resistive mixer.

In the resistive mixer 100 of Embodiment 1, a negative capacitance circuit 2 acting as a capacitor having a negative capacitance is connected between a drain and a source of a mixer transistor 1. FIG. 2 illustrates a specific example of the negative capacitance circuit 2. In the embodiments of present invention, a negative capacitance circuit is not limited to the negative capacitance circuit illustrated in FIG. 2.

The negative capacitance circuit 2 (2A) includes first and second transistors (field effect transistors) T1 and T2, first to fourth capacitors C1 to C4, and first to fourth DC supply circuits (DC voltage supply circuits) 21 to 24.

In the negative capacitance circuit 2A illustrated in FIG. 2, one terminal of the first capacitor C1 is connected to the drain of the mixer transistor 1, and the other terminal of the first capacitor C1 is connected to one terminal of the second capacitor C2. The other terminal of the second capacitor C2 is connected to a gate of the first transistor T1, and one terminal of the third capacitor C3 is connected to a drain of the first transistor T1.

Further, the other terminal of the third capacitor C3 is connected to a gate of the second transistor T2, one terminal of the fourth capacitor C4 is connected to a source of the second transistor T2, the other terminal of the fourth capacitor C4 is connected to a connection line between the first capacitor C1 and the second capacitor C2, and the sources of the first and second transistors T1 and T2 are grounded.

Further, the first DC supply circuit 21 supplies a first DC voltage V1 to a connection line between the second capacitor C2 and the gate of the first transistor T1. The second DC supply circuit 22 supplies a second DC voltage V2 to a connection line between the drain of the first transistor T1 and the third capacitor C3. The third DC supply circuit 23 supplies a third DC voltage V3 to a connection line between the third capacitor C3 and the gate of the second transistor T2. The fourth DC supply circuit 24 supplies a fourth DC voltage V4 to a drain of the second transistor T2.

Figure 3:
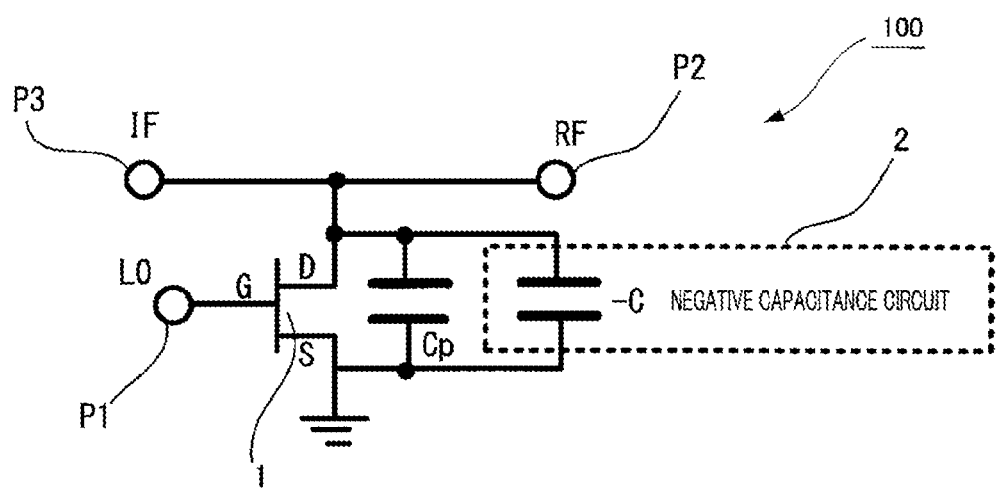
FIG. 3 is a diagram illustrating a state in which the negative capacitance circuit is connected in parallel to a parasitic capacitance generated between the drain and the source of the mixer transistor in the resistive mixer.
Figure 4:
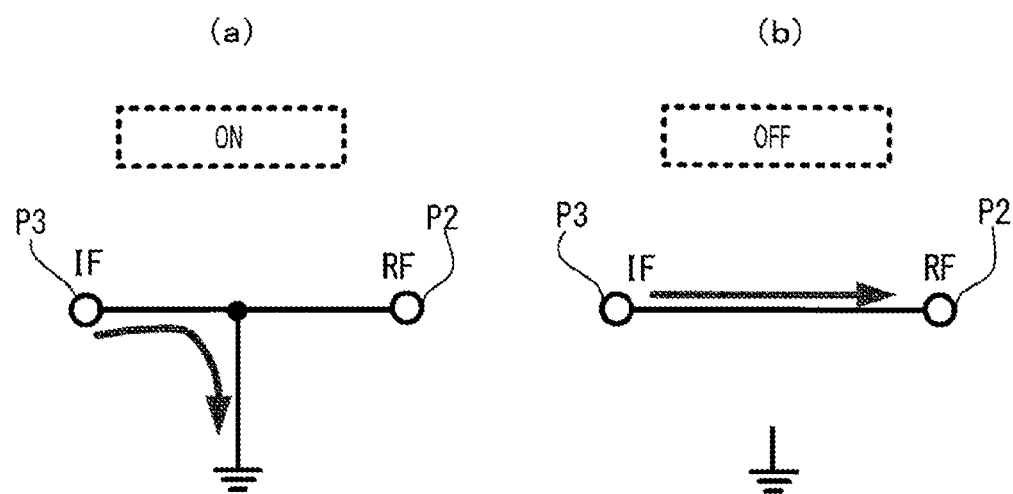
FIG. 4 is a diagram illustrating a flow of a signal when the mixer transistor in the resistive mixer is ON and OFF.

In the resistive mixer 100 illustrated in FIG. 1, a parasitic capacitance Cp is generated between the drain and the source of the mixer transistor 1, as illustrated in FIG. 3. In this case, the negative capacitance circuit 2 is connected in parallel to the parasitic capacitance Cp, and the parasitic capacitance Cp is canceled out in a wide band by the negative capacitance circuit 2 connected in parallel. Therefore, a signal does not flow to a ground through the parasitic capacitance Cp at the time of OFF (see FIG. 4(b)), the off-impedance is increased, and frequency conversion efficiency is improved.

Figure 5:
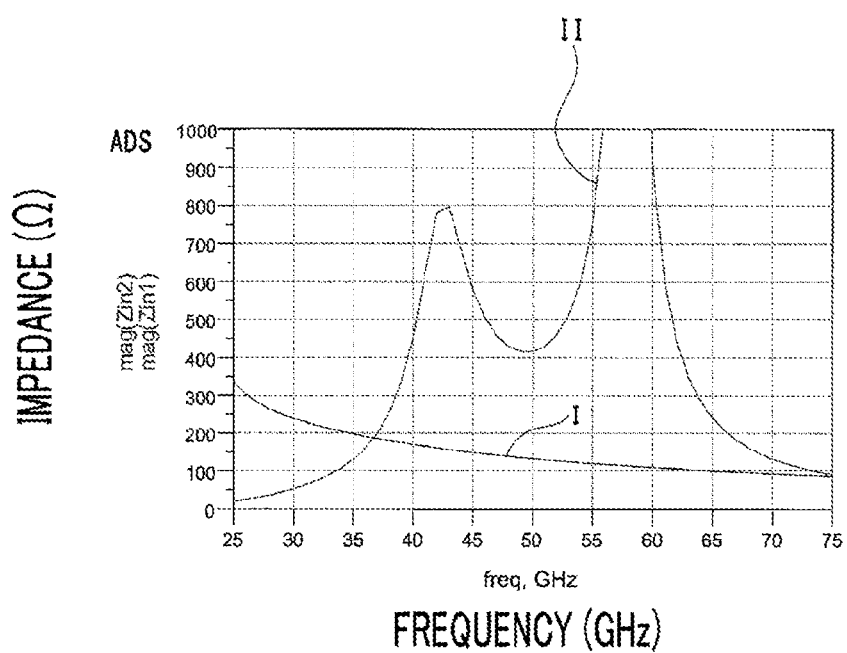
FIG. 5 is a diagram illustrating a simulation result of off-impedance when a negative capacitance circuit is added and a negative capacitance circuit is not added.

FIG. 5 illustrates simulation results of off-impedance when the negative capacitance circuit 2 is added and when the negative capacitance circuit 2 is not added. In this example, the negative capacitance circuit 2A illustrated in FIG. 2 is used for the simulation when the negative capacitance circuit 2 is added. In the negative capacitance circuit 2A, the transistors T1 and T2 are InP-HEMT transistors, and the capacitors C1 to C4 are ideal decoupling capacitors that cut a direct current. A circuit not including the negative capacitance circuit 2A illustrated in FIG. 2 is used for the simulation when the negative capacitance circuit 2 is not added. Further, in the simulation, an OFF voltage is applied to an LO signal terminal P1, and the impedance viewed from RF and IF signal terminals P2 and P3 is simulated.

A line I in FIG. 5 shows an absolute value of the off-impedance when the negative capacitance circuit 2A is not added. When the negative capacitance circuit 2A is not added, the impedance, which is 160Ω at 40 GHz, gradually decreases at higher frequencies and becomes about 100Ω at 63 GHz. On the other hand, a line II in FIG. 5 indicates an absolute value of the off-impedance when the negative capacitance circuit 2A is added. It can be seen that, when the negative capacitance circuit 2A is added, a drain impedance can be increased to 400Ω or more at 40 to 63 GHz.

Embodiment 2

Figure 6:
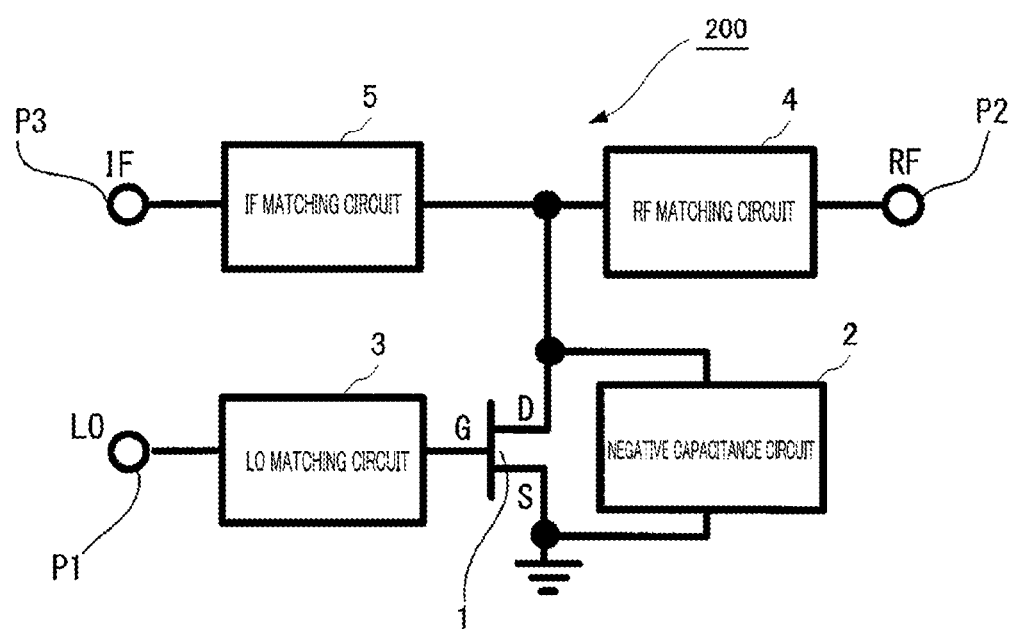
FIG. 6 illustrates main units of a resistive mixer according to Embodiment 2 of the present invention.

FIG. 6 illustrates main units of a resistive mixer 200 according to Embodiment 2 of the present invention. In FIG. 6, the same reference signs as those in FIG. 1 denote components the same as or equivalent to those described with reference to FIG. 1, and description thereof will be omitted.

A matching circuit for matching impedance of external loads connected to respective ports of an LO signal terminal P1, an RF signal terminal P2, and an IF signal terminal P3 with impedance when an inside of a circuit is viewed from a gate and a drain of a mixer transistor 1 is necessary in order to improve conversion efficiency of a mixer.

Therefore, in the resistive mixer 200 according to Embodiment 2, an LO matching circuit (a first matching circuit) 3 is connected between the LO signal terminal P1 and the gate of the mixer transistor 1, an RF matching circuit (a second matching circuit) 4 is connected between the RF signal terminal P2 and the drain of the mixer transistor 1, and an IF matching circuit (a third matching circuit) 5 is connected between the IF signal terminal P3 and the drain of the mixer transistor 1.

Expansion of Embodiment

The present invention has been described above with reference to the embodiments, but the present invention is not limited to the above embodiments. Various changes that can be understood by those skilled in the art can be made to the configuration or details of the present invention within the scope of the technical idea of the present invention.

REFERENCE SIGNS LIST

1 Mixer transistor
2 (2A) Negative capacitance circuit
P1 LO signal terminal
P2 RF signal terminal
P3 IF signal terminal
Cp Parasitic capacitance
T1 First transistor
T2 Second transistor
C1 First capacitor
C2 Second capacitor
C3 Third capacitor C4 Fourth capacitor
21 First DC supply circuit
22 Second DC supply circuit
23 Third DC supply circuit
24 Fourth DC supply circuit
LO matching circuit
4 RF matching circuit
5 IF matching circuit
100, 200 Resistive mixer.

The invention claimed is:

1. A mixer comprising:
a mixer transistor having a gate connected to an LO signal terminal and a drain connected to an RF signal terminal and an IF signal terminal; and
a negative capacitance circuit connected between the drain of the mixer transistor and a source of the mixer transistor, wherein the negative capacitance circuit is configured to cancel out parasitic capacitance between the drain and the source of the mixer transistor.

2. The mixer according to claim 1, wherein the negative capacitance circuit comprises:
a first transistor and a second transistor; and
a first DC voltage supply circuit connected to a gate of the first transistor;
a second DC voltage supply circuit connected to drain of the first transistor;
a third DC voltage supply circuit connected to a gate of the second transistor; and
a fourth DC voltage supply circuit connected to a drain of the second transistor.

3. The mixer according to claim 2, wherein the negative capacitance circuit further comprises a first capacitor and a second capacitor, wherein a first terminal of the first capacitor is connected to the drain of the mixer transistor, and wherein a second terminal of the first capacitor is connected to a first terminal of the second capacitor.

4. The mixer according to claim 3, wherein a second terminal of the second capacitor is connected to a gate of the first transistor.

5. The mixer according to claim 3, wherein the negative capacitance circuit further comprises a third capacitor, wherein a first terminal of the third capacitor is connected to a drain of the first transistor, and wherein a second terminal of the third capacitor is connected to a gate of the second transistor.

6. The mixer according to claim 5, wherein the negative capacitance circuit further comprises a fourth capacitor, wherein a first terminal of the fourth capacitor is connected to a source of the second transistor, and wherein a second terminal of the fourth capacitor is connected to a connection line between the first capacitor and the second capacitor.

7. The mixer according to claim 6, wherein a source of the first transistor and a source of the second transistor are grounded.

8. The mixer according to claim 6, wherein the first DC voltage supply circuit supplies a first DC voltage to a connection line between the second capacitor and a gate of the first transistor, the second DC voltage supply circuit supplies a second DC voltage to a connection line between a drain of the first transistor and the third capacitor, the third DC voltage supply circuit supplies a third DC voltage to a connection line between the third capacitor and a gate of the second transistor, and the fourth DC voltage supply circuit supplies a fourth DC voltage to a drain of the second transistor.

9. The mixer according to claim 1, wherein:
a first matching circuit is connected between the LO signal terminal and the gate of the mixer transistor;
a second matching circuit is connected between the RF signal terminal and the drain of the mixer transistor; and
a third matching circuit is connected between the IF signal terminal and the drain of the mixer transistor.

10. A method comprising:
providing a mixer transistor having a gate connected to an LO signal terminal and a drain connected to an RF signal terminal and an IF signal terminal; and
connecting a negative capacitance circuit between the drain of the mixer transistor and a source of the mixer transistor, wherein the negative capacitance circuit is configured to cancel out parasitic capacitance between the drain and the source of the mixer transistor.

11. The method according to claim 10, wherein the negative capacitance circuit comprises:
a first transistor and a second transistor; and
a first DC voltage supply circuit connected to a gate of the first transistor;
a second DC voltage supply circuit connected to drain of the first transistor;
a third DC voltage supply circuit connected to a gate of the second transistor; and
a fourth DC voltage supply circuit connected to a drain of the second transistor.

12. The method according to claim 11, wherein the negative capacitance circuit further comprises a first capacitor and a second capacitor, wherein a first terminal of the first capacitor is connected to the drain of the mixer transistor, and wherein a second terminal of the first capacitor is connected to a first terminal of the second capacitor.

13. The method according to claim 1, wherein a second terminal of the second capacitor is connected to a gate of the first transistor.

14. The method according to claim 1, wherein the negative capacitance circuit further comprises a third capacitor, wherein a first terminal of the third capacitor is connected to a drain of the first transistor, and wherein a second terminal of the third capacitor is connected to a gate of the second transistor.

15. The method according to claim 14, wherein the negative capacitance circuit further comprises a fourth capacitor, wherein a first terminal of the fourth capacitor is connected to a source of the second transistor, and wherein a second terminal of the fourth capacitor is connected to a connection line between the first capacitor and the second capacitor.

16. The method according to claim 15, wherein a source of the first transistor and a source of the second transistor are grounded.

17. The method according to claim 15, wherein the first DC voltage supply circuit supplies a first DC voltage to a connection line between the second capacitor and a gate of the first transistor, the second DC voltage supply circuit supplies a second DC voltage to a connection line between a drain of the first transistor and the third capacitor, the third DC voltage supply circuit supplies a third DC voltage to a connection line between the third capacitor and a gate of the second transistor, and the fourth DC voltage supply circuit supplies a fourth DC voltage to a drain of the second transistor.

18. The method according to claim 10, wherein:
a first matching circuit is connected between the LO signal terminal and the gate of the mixer transistor;

a second matching circuit is connected between the RF signal terminal and the drain of the mixer transistor; and a third matching circuit is connected between the IF signal terminal and the drain of the mixer transistor.

* * * * *